United States Patent
Albrecht et al.

(10) Patent No.: US 6,239,685 B1
(45) Date of Patent: May 29, 2001

(54) BISTABLE MICROMECHANICAL SWITCHES

(75) Inventors: Thomas Robert Albrecht, San Jose; Timothy Clark Reiley, Los Gatos, both of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/418,011

(22) Filed: Oct. 14, 1999

(51) Int. Cl.$^7$ .......................... H01H 37/46; H01H 37/48
(52) U.S. Cl. .......................... 337/365; 337/333; 337/36; 337/53; 337/89; 251/129.02
(58) Field of Search ..................................... 337/333, 139, 337/140, 14, 16, 36, 53, 52, 85, 89, 362, 365; 251/129.02

(56) References Cited

U.S. PATENT DOCUMENTS

| | | | |
|---|---|---|---|
| 5,029,805 | * 7/1991 | Albarda et al. | 251/11 |
| 5,058,856 | * 10/1991 | Gordon et al. | 251/11 |
| 5,061,914 | * 10/1991 | Busch et al. | 337/140 |
| 5,069,419 | * 12/1991 | Jerman | 251/11 |
| 5,182,910 | 2/1993 | Benecke . | |

(List continued on next page.)

FOREIGN PATENT DOCUMENTS

| | | | | |
|---|---|---|---|---|
| 3517551 | * 10/1985 | (DE) | | 200/310 |
| 5-62494 | * 3/1993 | (JP) | | G11C/23/00 |
| 10-173306 | * 6/1998 | (JP) | | H05K/1/14 |
| 11-78004 | * 3/1999 | (JP) | | B41J/2/45 |

OTHER PUBLICATIONS

Xi–Qing Sun, K. R. Farmer, and W. N. Carr, "A Bistable Microreplay Based on Two–Segment Multimorph Cantilever Actuators," 1998, pp. 154–159.

Werner Riethmüller and Wolfgang Benecke, *Thermally Excited Silicon Microactuators*, vol. 35, No. 6, Jun. 1988, pp. 758–763.

Hirotsugu Matoba, Toshio Ishikawa, Chang–Jin Kim and Richard S. Muller, "A Bistable Snapping Microactuator," 1994, pp. 45–50.

*Primary Examiner*—Leo P. Picard
*Assistant Examiner*—Anatoly Vortman
(74) *Attorney, Agent, or Firm*—Thomas R. Berthold, Esq.; Banner & Witcoff, Ltd.

(57) ABSTRACT

A bistable micromechanical switch that includes a substrate, at least two anchor points formed on the substrate, and a beam structure that includes a two-material beam attached to at least two anchor points. The two-material beam has a first portion, a second portion and a center portion. The first portion of the two-material beam is formed from a first layer of a first material and a second layer of a second material such that the first layer of the first portion is proximate to the surface of the substrate and the second layer of the first portion is remote from the surface of the substrate. The first material has a first coefficient of thermal expansion and the second material has a second coefficient of thermal expansion such that the second coefficient of thermal expansion is greater than the first coefficient of thermal expansion. The second portion of the two-material beam is formed from a first layer of the second material and a second layer of the first material such that the first layer of the second portion is proximate to the surface of the substrate and the second layer of the second portion is remote from the surface of the substrate. The beam structure has a first and a second stable state such that the center portion of the beam structure is deflected toward the surface of the substrate for the first stable state and is deflected away from the surface of the substrate for the second stable state.

27 Claims, 8 Drawing Sheets

U.S. PATENT DOCUMENTS

| | | | |
|---|---|---|---|
| 5,325,880 | * | 7/1994 | Johnson et al. .......................... 137/1 |
| 5,430,597 | | 7/1995 | Bagepalli et al. . |
| 5,465,186 | | 11/1995 | Bajorek et al. . |
| 5,467,068 | | 11/1995 | Field et al. . |
| 5,536,963 | * | 7/1996 | Polla .................................... 257/417 |
| 5,619,177 | * | 4/1997 | Johnson et al. ..................... 337/140 |
| 5,635,750 | * | 6/1997 | Schlaak et al. ...................... 257/414 |
| 5,638,946 | | 6/1997 | Zavracky . |
| 5,699,212 | | 12/1997 | Erpelding et al. . |
| 5,757,590 | | 5/1998 | Phipps et al. . |
| 5,759,428 | | 6/1998 | Balamane et al. . |
| 5,796,152 | | 8/1998 | Carr et al. . |

* cited by examiner

BISTABLE MICROMECHANICAL SWITCHES

BACKGROUND OF THE INVENTION

1. Field of the Invention

The present invention relates to the field of microactuators. More particularly, the present invention relates to bistable microactuators as used in disk drives and tape drives.

2. Description of the Related Art

Magnetoresistive (MR), giant magnetoresistive (GMR) and magnetic tunnel junction (MTJ) heads for disk drives are among the most ESD-sensitive components that are used in industry today. For example, currently-used heads can be permanently damaged by only a few 10s of Volts being discharged from a human body. GMR heads suffer from a loss of initialization for even smaller discharges. Moreover, reductions in thin-film dimensions that are associated with each new generation of MR, GMR and MTJ heads make such heads even more prone to ESD damage.

ESD damage to MR/GMR/MTJ heads is a significant source of yield loss in disk drives. Head yields are in the 95% to 99% range and a large number of heads are used in disk drives (2–20 per drive). Drive yields would be unacceptably low without intermediate testing of heads. Consequently, heads are tested at several stages of drive assembly, allowing a faulty head to be replaced before being integrated into a larger assembly that is relatively more expensive to replace or repair.

ESD protection diodes have been successfully used on I/O connections of integrated circuits and other sensitive components for preventing ESD damage. ESD protection diodes, however, provide limited protection for an MR/GMR/MTJ head, while creating undesirable noise during normal operation of the MR/GMR head. An MR/GMR head has a resistance of about 35 Ohms and operates with a bias current of about 10 mA. In normal operation, a bias voltage of 0.35 V appears across an MR/GMR head (which may be higher for high resistance heads). In order to shunt harmful current away from an MR/GMR head, an ESD diode must have an effective impedance that is significantly less than 35 Ohms (say, about 1 Ohm) for high currents. Diodes with such high conductivity, however, have a large leakage current at the operating bias voltage of an MR/GMR head that produces noise across the head.

Additionally, diodes having sufficient conductivity tend to be physically large, and at normal operating conditions have a large junction capacitance that adversely affects the ability of a head to perform at high data rates. Furthermore, fabrication of protection diodes close to the head elements (which is needed for good ESD protection) requires introduction of semiconducting materials and appropriate processes into the head fabrication process that are major departures from conventional head fabrication techniques.

An alternative form of ESD protection that can be used for MR/GMR/MTJ heads is laser-delete shorting. For laser-delete shorting, temporary conducting traces are fabricated across a head element for ESD protection. After the heads have been safely integrated into an actuator, a laser beam pulse removes the temporary trace. During the time the trace is in place, the head cannot be tested because the temporary trace short-circuits the head element. After the temporary trace has been deleted, the head can be tested, but ESD protection no longer exists.

Laser-delete shorting can be extended to a plurality of temporary traces, of which only one or a few are used at a time for providing ESD protection. In such an approach, a ladder-type arrangement of temporary traces is fabricated having temporary traces as rungs in the ladder structure. To establish a temporary trace, a laser pulse (or pulses) of a predetermined energy intensity are applied to a selected trace for establishing a shorting trace. To (permanently) remove the trace, a laser pulse (or pulses) of yet a greater energy intensity are applied to the trace. Traces are established and removed by sequentially selecting different temporary traces in the ladder structure. Nevertheless, such a ladder-type arrangement has the drawback of being complex and occupying valuable space.

Because of these shortcomings mentioned above, neither ESD protection diodes nor laser-delete shorting have been conventionally used in MR/GMR/MTJ heads, leaving heads vulnerable to ESD.

An ideal ESD protection for an MR/GMR/MTJ head would successfully shunt harmful currents or voltages away from the head without affecting the normal operation of the head. Moreover, an ideal ESD head-protection device would also allow a head to be tested during fabrication and during assembly of a disk drive. What is needed is a technique for providing ESD protection for an MR/GMR/MTJ head that allows testing during head fabrication and drive assembly.

SUMMARY OF THE INVENTION

The present invention provides an ESD protection technique for an MR/GMR/MTJ head that allows testing during head fabrication and drive assembly.

The advantages of the present invention are provided by a bistable micromechanical switch that includes a substrate having a surface, at least two anchor points formed on the substrate, and a beam structure that includes a two-material beam attached to at least two anchor points. The two-material beam has a first portion, a second portion and a center portion. The first portion of the two-material beam is formed from a first layer of a first material and a second layer of a second material such that the first layer of the first portion is proximate to the surface of the substrate and the second layer of the first portion is remote from the surface of the substrate. The first material has a first coefficient of thermal expansion and the second material has a second coefficient of thermal expansion such that the second coefficient of thermal expansion is greater than the first coefficient of thermal expansion. Preferably, the first material is selected from the group consisting of Cr, Ta, W and Mo, and the second material is selected from the group consisting of Ni, Fe and Co. The second portion of the two-material beam is formed from a first layer of the second material and a second layer of the second material such that the first layer of the second portion is proximate to the surface of the substrate and the second layer of the second portion is remote from the surface of the substrate. The beam structure has a first and a second stable state such that the center portion of the beam structure is deflected toward the surface of the substrate for the first stable state and is deflected away from the surface of the substrate for the second stable state.

According to the invention, the two-material beam transitions from the first stable state to the second stable state when thermal energy is applied to the second portion of the two-material beam. Similarly, the two-material beam transitions from the second stable state to the first stable state when thermal energy is applied to the first portion of the two-material beam. Preferably, the thermal energy applied to either the first or second portions of the two-material beam is generated using a laser beam. Alternatively, the thermal energy applied to either the first or second portions of the two-material beam is generated using electrical energy.

A contact element can be formed on the surface of the substrate and another contact element can be formed on center portion of the beam structure proximate to the surface of the substrate. Preferably, the contact elements are formed from an Au/Ni alloy. The two contact elements can then be electrically connected to a read/write head. The contact element formed on the center portion of the two-material beam contacts the contact element on the surface of the substrate when the two-material beam is in the first stable state, and thereby provides ESD protection.

For a first embodiment of the present invention, the two-material beam forming the beam structure is under a compressive stress. For this embodiment, the two-material material beam can further include a third portion and a fourth portion such that the third portion is located between the first portion and the center portion and the fourth portion is located between the center portion and the second portion. The third portion of the two-material beam is formed from a first layer of the second material and a second layer of the first material with the first layer of the third portion being proximate to the surface of the substrate and the second layer of the third portion being remote from the surface of the substrate. The fourth portion of the two-material beam is formed from a first layer of the first material and a second layer of the second material with the first layer of the fourth portion being proximate to the surface of the substrate and the second layer of the fourth portion being remote from the surface of the substrate.

A second embodiment of the present invention includes at least three anchor points formed on the substrate. The first leg of the beam structure is part of a two-material beam that is attached to a first anchor point. Similarly, the second leg of the beam structure is part of the two-material beam and is attached to a second anchor point. The beam structure further includes a center leg formed from a single material that is attached between a third anchor point and a center portion of the two-material beam. According to the invention, the center leg is under a tensile stress.

BRIEF DESCRIPTION OF THE DRAWING

The present invention is illustrated by way of example and not limitation in the accompanying figures in which like reference numerals indicate similar elements and in which.

DETAILED DESCRIPTION

The present invention provides a nonvolatile, thin-film, surface-micromachined, bistable mechanical switch/relay that is thermally actuated by a heat source, such as an external laser beam source or an internal electrical heat source. According to the invention, a bistable micromechanical switch of the present invention allows selective shorting of an MR/GMR/MTJ element in a magnetic recording head for protection from electrostatic discharge currents during head fabrication, assembly, handling and testing.

The present invention provides two preferred embodiments. A primary distinction between the two preferred embodiments is that for the first embodiment, a mechanical beam that stabilizes the two switch states is under compression. For the second embodiment, a mechanical beam that stabilizes the two switch states is under tension. Switching between states for either of the two preferred embodiments of the present invention is preferably activated by a non-contact, laser-induced thermal activation. The present invention is also extendible to provide a current-driven thermal actuation using an externally-applied electrical power.

A micromechanical bistable switch of the present invention is innovative not only from the point of view of MR/GMR/MTJ ESD protection, but also from the point of view of microfabricated mechanical switch technology. Most conventional micromechanical switches are momentary contact relays that require a constant application of a control signal for maintaining at least one of the switched states. Both embodiments of the present invention remain stable in either of the two switched states, and requires energy only when switching between the two states. Several conventional bistable switches do not require energy input to maintain either state. See, for example, B. Haig, On a Nonvolatile Memory Cell Based on Micro-Electro-Mechanics, Proc. IEEE MEMS Workshop, Napa Valley, Calif., February 1990, pp. 172–176; H. Matoba et al., A Bistable Snapping Microactuator, Proc. IEEE MEMS Workshop, Oiso, Japan, January 1994, pp. 45–50; and X. -Q. Sun et al., A Bistable Microrelay Based On Two-Segment Multimorph Cantilever Actuators, Proc. IEEE MEMS Workshop, Heidelberg, Germany, Jan. 1998, pp. 154–159.

Figure 1A:
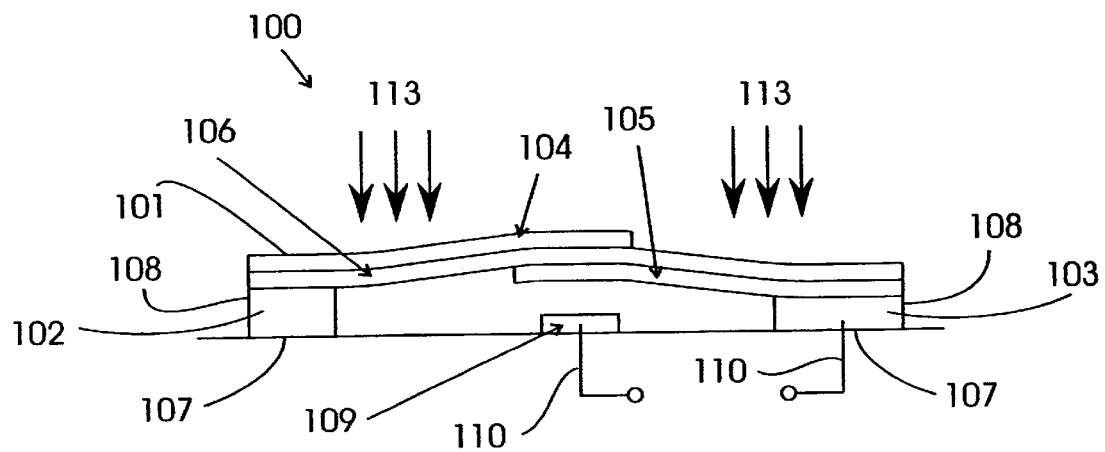
FIGS. 1(a)–1(c) show different views of a compressive single-beam bistable switch according to a laser-actuated configuration of the first embodiment of the present invention.
Figure 1B:
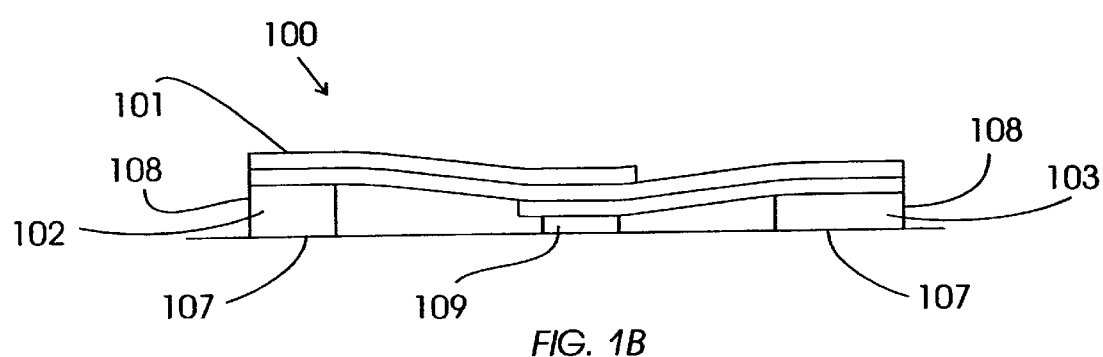
Figure 1C:
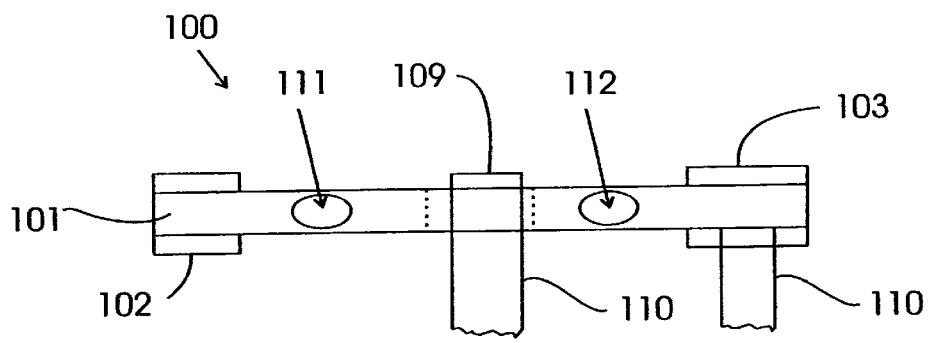

FIGS. 1(a)–1(c) show different views of a nonvolatile, single-beam bistable switch 100 according to a laser-actuated configuration of the first embodiment of the present invention. FIG. 1(a) shows a side view of bistable switch 100 when switch 100 is in an open state. FIG. 1(b) shows a side view of switch 100 when switch 100 is in a closed state. FIG. 1(c) shows a top view of switch 100. Bistable switch 100 includes a beam structure that is formed by a trilayer beam 101. Trilayer beam 101 is supported above a substrate surface S at each end by an anchor point. For the specific configuration of the first embodiment of the present invention shown in FIG. 1, the anchor points are embodied as a pedestal 102 and a pedestal 103. Each pedestal 102, 103 has a base 107 that is attached to substrate S and a top 108 that is remote from substrate S. Top and bottom layers 104, 105 of beam 101 are made of a first material A, while a middle layer 106 is made of a second material B.

Beam 101 is under compression so that it has a curved, buckled shape in each of the bistable states, as shown in FIGS. 1(a) and 1(b). Beam 101 can be deflected upwardly (the "open" state shown in FIG. 1(a)) or deflected downwardly (the "closed" state shown in FIG. 1(b)). Because beam 101 is under compression, beam 101 is stable in either of the two states respectively shown in FIGS. 1(a) and 1(b).

A contact element 109 is located on substrate S under the center of beam 101. An electrical connection is made between contact element 109 and bottom layer 105 of beam 101, and an MR head 204 (FIG. 2(a)) through electrical connections 110. In the closed state, switch 100 forms a closed circuit by physical contact of contact element 109 to bottom layer 105. In the open state, contact element 109 and bottom layer 105 are not in physical contact with each other.

Transitions between the bistable switch states occur in response to a heating pulse applied to one of two target regions 111, 112. Preferably, the heating pulse is generated by a laser beam 113 directed at a selected target region. Target region 111 is a "closing" target region, and target region 112 is an "opening" target region. Materials A and B are chosen so that their respective coefficients of thermal expansion (CTE) are significantly different, with material A having a higher CTE value than material B. Local heating of closing target region 111 causes a downward bending moment on the left side of beam 101, which, in the absence of bending moments elsewhere in beam 101, causes beam 101 to transition to the closed state if the bending moment (due to heating) is sufficiently large. Similarly, local heating of opening target region 112 causes beam 101 to transition to the open state.

Using a laser beam for inducing state transitions has three advantages: 1) switch 100 can be repeatedly opened and closed for testing purposes without touching the slider and potentially damaging the slider or its suspension; 2) no additional bonding pads for control connections are needed; and 3) no additional wires to the slider are needed. Because existing bonding pads for the head elements already consume the available area for pads on pico sliders, adding extra pads would require smaller pads and more complex wire bonding techniques. Adding additional wires to the slider results in increased gimbal stiffness and potential new sources for static attitude errors.

Switch 100 can be fabricated on the back of a slider, that is, on top of and/or next to the head elements. Making the structure of switch 100 small (on the order of 50 microns wide) has two advantages: 1) the mass of beam 101 is lowered, thereby lowering sensitivity to external shock and vibration that can cause a state transition; and 2) switch 100 is more easily fit into the available area on the rear of the slider, leaving sufficient room for bonding pads, etc. Because the present invention is intended to be fabricated on top of a finished recording head wafer, a range of constraints regarding the materials, deposition techniques (particularly with respect to the maximum allowable temperature of about 250 C) are imposed on a bistable switch of the present invention.

The relatively large heating areas provided by the present invention minimizes the requirements for laser focussing and alignment precision. To allow sufficiently rapid heating of one side only of a bistable switch without either excessive thermal loss or heating of the other side, power must be able to be delivered relatively rapidly (on the order of $10^{-1}$ s.). This can be accomplished using, for example, a fiber optic line or fiber optic bundle that delivers the output energy of a compact laser diode array having an output power of about 5 W. An anti-reflective (AR) coating can be applied to target regions 111, 112 for increasing absorption of the incident light, thereby increasing the rate of heating and/or for further reducing the required output power of the laser. AR coatings for light having a wavelength that is preferably in the range of about 0.8 to 1.5 microns are described in basic optical texts and are commercially available. See, for example, W. G. Driscoll, Handbook of Optics, McGraw-Hill, 1978; or M. Born et al., Principles of Optics, Pergamon Press, 1975, each of which are incorporated by reference herein.

The overall state of stress of beam 101 in its operational condition must be compressive. This is the source of beam 101 deflecting into the two stable states (buckled up and buckled down). It is also desirable to have all of the materials forming beam 101 in roughly the same state of stress at room temperature to avoid unwanted distortion. Consequently, the materials and deposition conditions should be chosen to give the same as-deposited state of compression. To estimate the desired beam compressive state, it is necessary to estimate the travel distance of the center of beam 101 upon activation. The beam center travel distance estimate is based on three additive displacement components: (1) the thickness of a release layer that has been removed beneath beam 101 for allowing motion in the vertical direction (about 2 or 3 microns); (2) some uncertainty in the equilibrium shape; and (3) the interference needed between the downward curving beam 101 and contact element 109. The interference between beam 101 and contact element 109 provides the contact load, and is directly dependent on the beam stiffness.

For example, it is estimated that a buckled displacement of beam 101 (from the horizontal) of approximately 6 microns at the center of the beam is needed to achieve a good contact load. For a 300 micron-long beam, such an exemplary buckled displacement corresponds to roughly a 2 mm radius of curvature, which translates into a required compressive strain of about 0.1%. The compressive stress needed in the as-deposited material is given by the elastic modulus multiplied by the strain. (The elastic moduli of Ni, Cr and Ta are respectively 210, 250 and 190 MPa.)

Two-material beam 101 contains two selected materials having differing coefficients of thermal expansion (CTE) that undergoes a change of curvature with a change in temperature. To maximize the effect, the difference in CTE of the two materials should be maximized. It is necessary for the selected materials to be easily deposited (e.g., by sputtering, evaporation or electroplating) under conditions that allow development of the relatively large intrinsic compressive stress. Furthermore, because the beams will be locally heated to several hundred degrees C, each time the state of the switch is switched, the selected set of materials preferably has a relatively high melting temperature to avoid recovery or recrystalization that would eliminate the as-deposited stress. It is also preferred that the thermal conductivity be relatively low to provide greater design freedom. Other considerations include cost and corrosion resistance as important considerations.

The preferred set of high CTE materials satisfying the requirements of the present invention are Ni, Fe and Co. The preferred set of low CTE materials for the present invention is Cr, Ta, W and Mo. Other materials and alloys will also be functional. Exemplary organic materials that can be used include a wide range of polymers having CTEs and states of stress, such as polyimide. Exemplary inorganic materials that can be used include dielectrics having suitable CTEs, such as $SiO_2$.

Because the MR stripe is connected in parallel with the closed bistable switch, it is necessary to keep the switch resistance at or below 1 Ohm assuring that most of the ESD current passes through the switch rather than through the MR resistor. To keep the contact resistance at or below the intrinsic resistance of the switch (about 0.1 Ohm), a contact pressure of about 1 mN is selected. If the only consideration for the contacts were the minimization of contact resistance, an Au-to-Au system would be suitable. This would allow minimum contact force to generate a contact resistance in the <0.1 Ohm range. The contact system, however, must be designed to avoid contact welding under an ESD event. A system that offers improvement over Au-to-Au in regard to contact welding is a Au/Ni alloy contact system. Such a system increases the required contact force over that for a Au-to-Au contact system to about 1 mN.

For a four (4) micron thick beam, 50 microns wide and 300 microns long (to a point on either end that is fully clamped) and a Ni/Cr couple, the beam stiffness (vertical displacement) at the center of the beam is about 0.5 kN/m, for fully clamped end conditions.

Figure 2A:
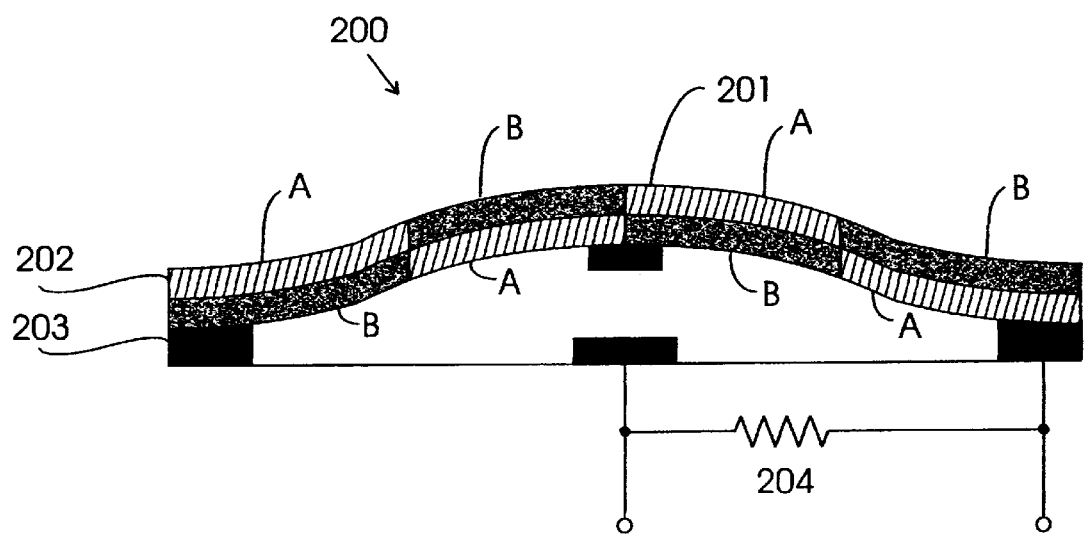
FIGS. 2(a) and 2(b) depict a compressive beam bistable switch having reversed material polarity at the attachment point according to the present invention.
Figure 2B:
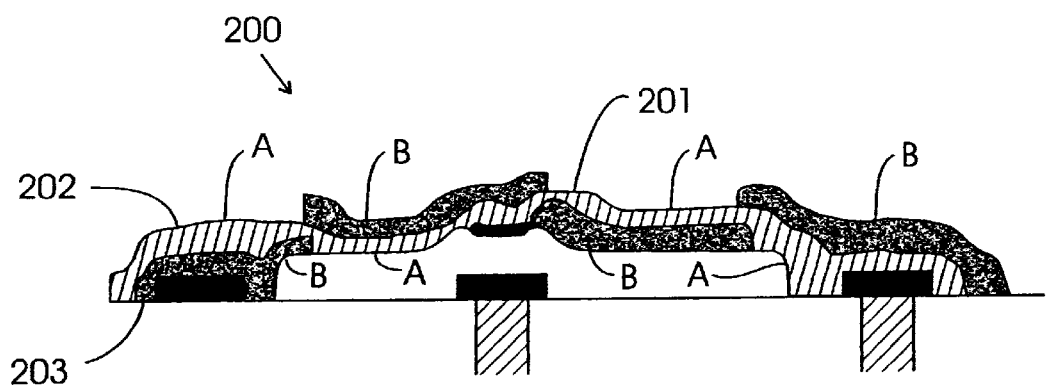

A measure of quality for a bistable switch according to the present invention is the amount of deflection arising from a given thermal energy input. One improvement on the simple switch shown in FIG. 1 is the reversal of the high TCE/low TCE materials near the anchor points of the beam, thereby maximizing the deflection by causing curvature near the anchor points to move the center of the beam in the desired direction. The effect is optimized by changing the material polarity in roughly each quarter of the beam. FIG. 2(a) conceptually depicts a compressive-beam bistable switch 200 having reversed material polarity at the attachment points according to the present invention. In FIG. 2(a), a beam structure 201 is formed from a layer 202 and a layer 203. Each layer is formed from two materials A and B that changes polarity in roughly each quarter of beam structure 201. FIG. 2(b) depicts a more accurate representation of a compressive bistable switch 201 having reversed material polarity at the attachment points according to the present invention.

A close modeling of the performance of the compressed beam switch (open or closed) in response to a transient heating pulse is quite difficult. Such a model is further complicated by the analytical complexity associated with mechanical buckling that occurs in the system. Estimates of the response of the beam to a temperature profile approximation obtained after about $10^{-5}$ s show that the average curvature exceeds the as-deposited curvature. Furthermore, the local curvature in the heated zone will exceed the buckling curvature, in which case the buckled shape is projected to be able to be inverted (in either direction).

Figure 3:
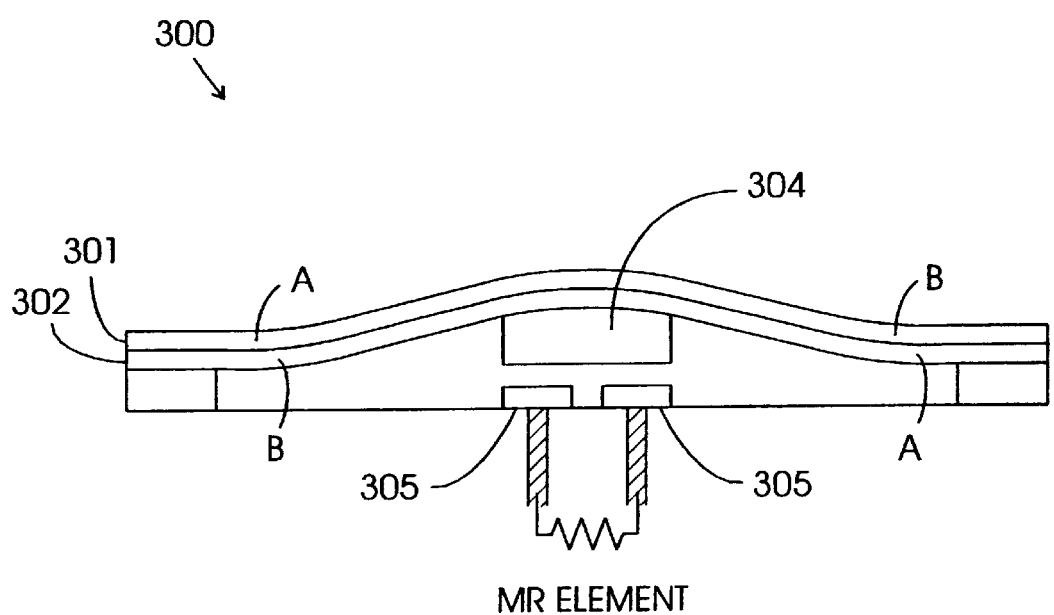
FIG. 3 conceptually shows a compressive single-beam bistable switch according to the present invention that uses a shorting bar.

FIG. 3 conceptually shows a compressive single-beam bistable switch 300 according to the present invention that uses a shorting bar. Switch 300 includes a beam structure that is formed from a layer 301 and a layer 302. Each layer is formed from two materials A and B that changes polarity in roughly each half of beam 300. A metallic shorting bar 304, formed to be on the bottom side of switch 300, contacts contact elements 305 when switch 300 is closed.

Figure 4A:
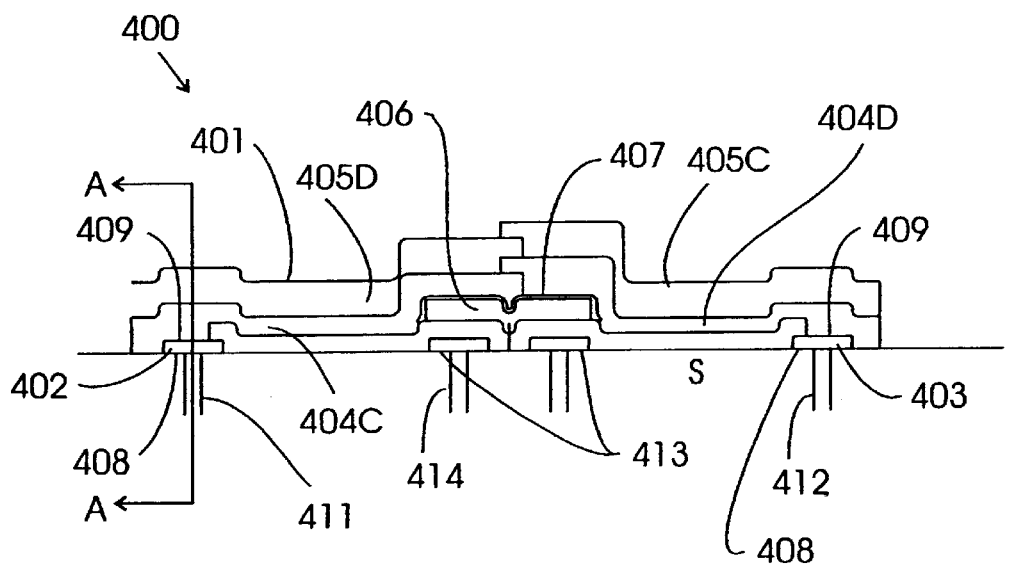
FIGS. 4(a)–4(b) show two views of a compressive single-beam bistable switch according to a current-actuated configuration of the first embodiment of the present invention.
Figure 4B:
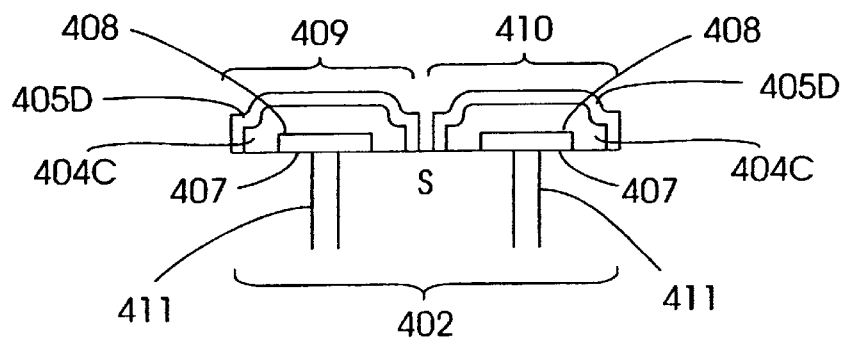
Figure 4C:
FIG. 4(c) shows a view of a first portion of the beam structure of the compressive single-beam bistable switch of FIG. 4(a)
Figure 4D:
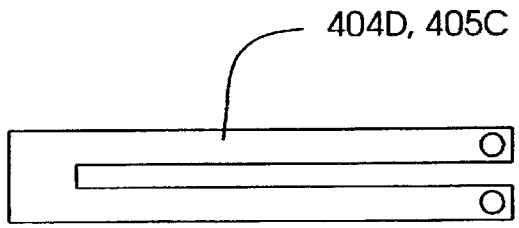
FIG. 4(d) shows a view of a second portion of the beam structure of the compressive single-beam bistable switch of FIG. 4(a)

FIGS. 4(a)–4(b) show two views of a nonvolatile, single-beam bistable switch 400 according to a current-actuated configuration of the first embodiment of the present invention. FIG. 4(a) shows a side view of bistable switch 400 when switch 400 is in an open state. FIG. 4(b) shows a cross-sectional view of switch 400 taken along view A—A in FIG. 4(a). FIG. 4(c) shows a top view of a first portion of the beam structure of switch 400. FIG. 4(d) shows a top view of a second portion of the beam structure of switch 400.

Bistable switch 400 includes a beam structure formed from a two-layer beam 401 that is supported above a substrate surface S at each end by an anchor point. For the specific configuration of the present invention shown in FIGS. 4(a)–4(d), the anchor points are embodied as a pedestal structure 402 and a pedestal structure 403. Each pedestal structure 402, 403 has a base 408 that is attached to substrate S and a top 409 that is remote from substrate S.

Beam 401 has a first layer 404 that is formed from a first material C and a second material D. Materials C and D are each conductive and are chosen so that their respective coefficients of thermal expansion (CTE) are significantly different, with material C preferably having a higher CTE value than material D.

The portion of first layer 404 formed from material C (denoted as 404C) extends from pedestal structure 402 to substantially the middle of beam 401. The portion of first layer 404 formed from material D (denoted as 404D) extends from substantially the middle of beam 401 to pedestal structure 403. A second layer 405 is formed on first layer 404. Second layer 405 is also formed from material C and material D. The portion of second layer 405 that is formed from material C (denoted as 405C) extends from pedestal structure 403 to substantially the middle of beam 401. The portion of second layer 405 that is formed from material D (denoted as 405D) extends from substantially the middle of beam 401 to pedestal structure 402. A shorting layer 406 is formed to be below an insulative layer 407. Beam 401 is formed to be under compression so that it is stable in either of the two bistable states. As shown in FIG. 4(a), beam 401 is deflected upwardly (the "open" state).

Pedestal structure 402 is formed to have two portions 409 and 410, as shown in FIG. 4(b). First layer 404C and second layer 405D are formed to have a split configuration corresponding to portions 409 and 410 of pedestal structure 402. FIG. 4(c) shows the split configuration of layers 404C and 405D. Pedestal structure portions 409 and 410 are each be formed to be conductive so that layers 404C and 405D are is in electrical contact with conductors 411.

Pedestal structure 403 is similarly formed to have two portions (not shown). Layers 404D and 405C are formed to have a split configuration corresponding to the two portions of pedestal structure 403. FIG. 4(d) shows the split configuration of layers 404D and 405C. The two portions of pedestal structure 403 are formed to be conductive so that layers 404D and 405C are in electrical contact with conductors 412.

Two contact elements 413 are located on substrate S under the middle of beam 401. An electrical connection is made between contact elements 413 and shorting layer 406, thereby forming a short-circuit across an MR head (not shown in FIGS. 4(a)–4(b) through electrical connections 414. In the closed state, switch 400 forms a closed circuit by physical contact of contact elements 413 to shorting layer 406. In the open state, contact elements 413 and shorting layer 406 are not in physical contact with each other.

Transitions between the bistable switch states of beam 401 occur in response to a heating pulse generated by selectively applying an electrical current pulse through layers 404C and 405D by way of conductors 411, or through layers 404D and 405C by way of conductors 412. Preferably, the current pulse is generated using a well-known technique, such as a controllable current source (not shown). As mentioned, materials C and D are chosen so that their respective coefficients of thermal expansion (CTE) are significantly different, with material C preferably having a higher CTE value than material D. Additionally, the respective resistivities of materials C and D are a consideration and the relative dimensions of layers 404C, 404D, 405C and 405D are a consideration for the selection of materials C and D.

To place beam 401 is a closed state, an electrical current pulse is applied to layers 404C and 405D. Local heating of layer 404C causes a downward bending moment on the left side of beam 401, which, in the absence of bending moments elsewhere in beam 401, causes beam 401 to transition to the open state if the bending moment (due to heating) is sufficiently large. To place beam 401 in a open state, a current pulse is applied to layers 404D and 405C. Local heating of 405D causes beam 401 to transition to the open state.

Figure 5A:
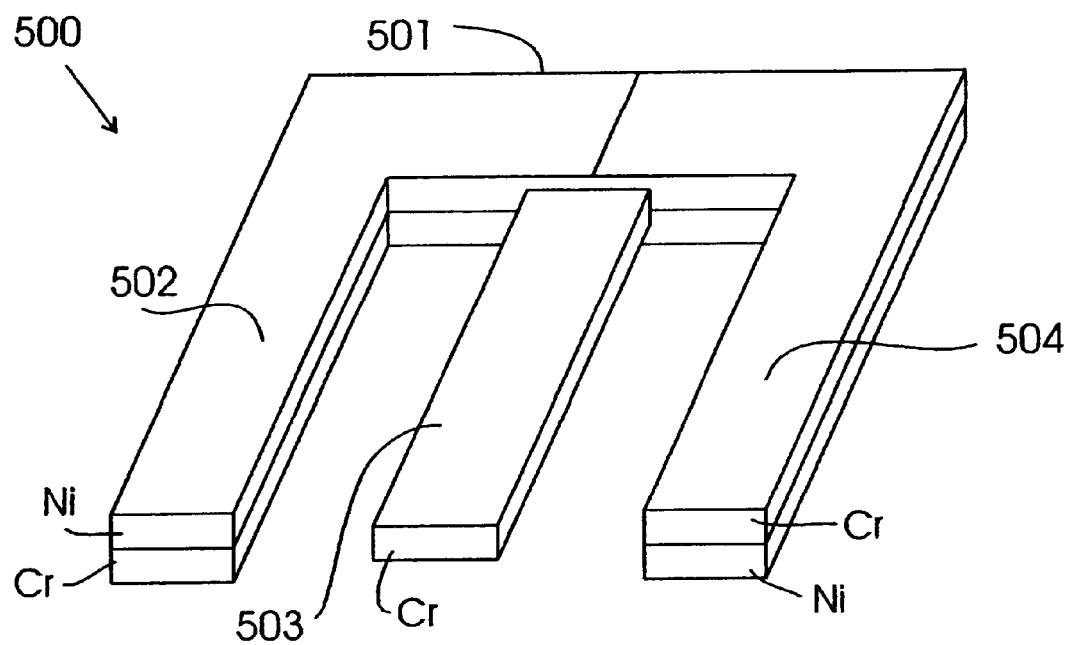
FIG. 5(a) shows a perspective view of a portion of a double two-material beam bistable switch having a central tensile stressed element for mechanical bias and induced buckling according to the second embodiment of the present invention.
Figure 5B:
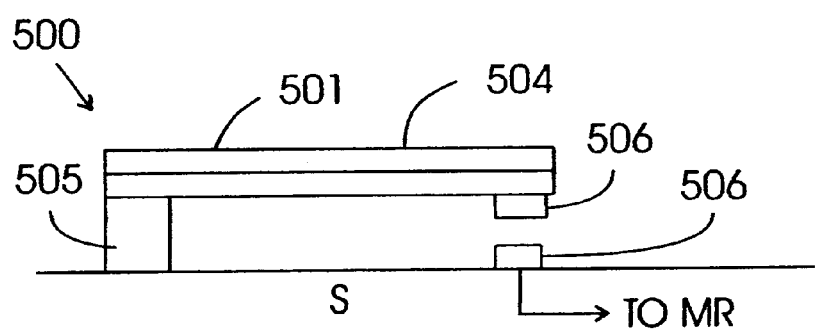
FIG. 5(b) shows a side view of the double two-material beam bistable switch of FIG. 5(a)

A second embodiment of the present invention is based on using a buckled beam that is under tension for stabilizing the two stable switch positions. FIG. 5(a) shows a perspective view of a portion of a double two-material beam bistable switch 500 according to the second embodiment of the present invention. Switch 500 includes a beam structure 501 having a left leg 502, a central leg 503, and a right leg 504. FIG. 5(b) shows a side view of double two-material beam bistable switch 500. Beam structure 501 is attached to an anchor point that is embodied as a pedestal 505. While only one pedestal is shown in FIG. 5(b), all three legs of beam 501 are attached to a pedestal. Pedestal 505 can be continuous between each of legs 502, 503 and 504, or an be a separate pedestal structure attached to each respective leg 502, 503 and 504. Contacts 506 are used for short-circuiting an MR head. Bistable switch 500 relies on a double two-material beams (legs 502 and 504) having reversed polarity on each of the two legs. Central leg 503 is a single-material beam under a tensile stress for mechanical bias and induced buckling.

Bistable switch 500 is activated by one or more lasers for accomplishing two things simultaneously: 1) the heating of central leg 503 to remove a built-in tensile stress by expanding central leg 503; and (2) the heating of either two-material leg 502 or 504 to bend switch 500 in the direction to open or close switch 500. Alternatively, bistable switch 500 is activated by selectively passing an electrical current through either left leg 502 and the central leg 503, or the central leg 503 and right leg 504.

The switch of FIGS. 5(a) and 5(b) is allowed to cool in such a manner that central leg 503 cools first, thereby applying tension to the switch and buckling the beam in the direction of curvature established by (either) slower cooling two-material beam legs 502 or 504. A variation on this approach is to use only one laser beam that is able to simultaneously heat central leg 503 and a selected two-material beam leg 502, 504. When the laser is turned off, central leg 503, which is under tensile stress at room temperature and has a smaller thermal time constant than beams 502, 504 by design, is able to cool more quickly than the heated two-material beam leg. This allows central leg 503 to mechanically bias switch 500 before the heated two-material beam leg can cool. An alternative laser heating arrangement is to use two independent laser beams that allow the heat source to the central leg to be turned off prior to turning off the heat source for the other legs.

Figure 6A:
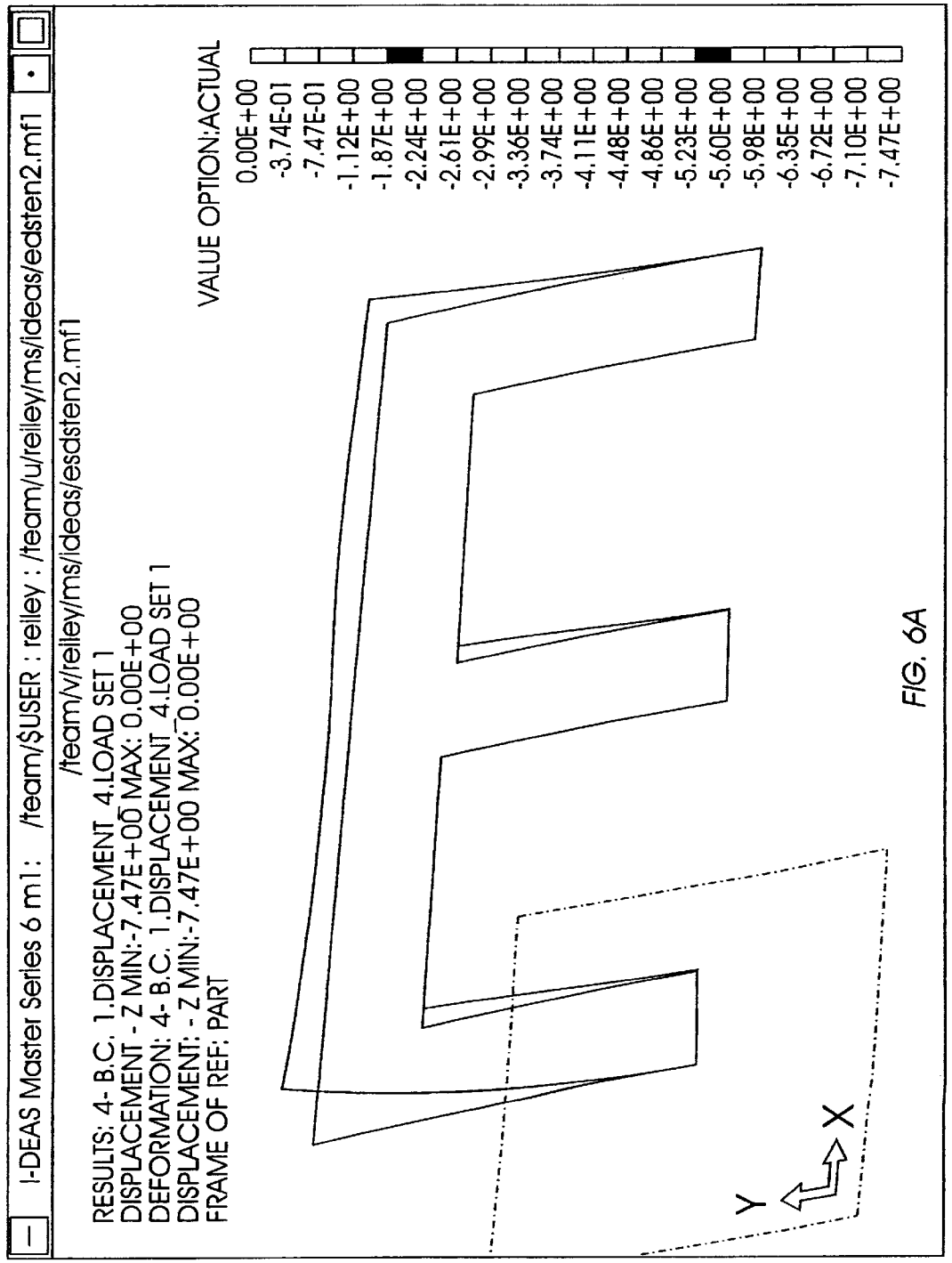
FIG. 6(a) shows the calculated displacement for the double two-material beam bistable switch of FIG. 5 when the left beam leg is heated to 200 C.
Figure 6B:
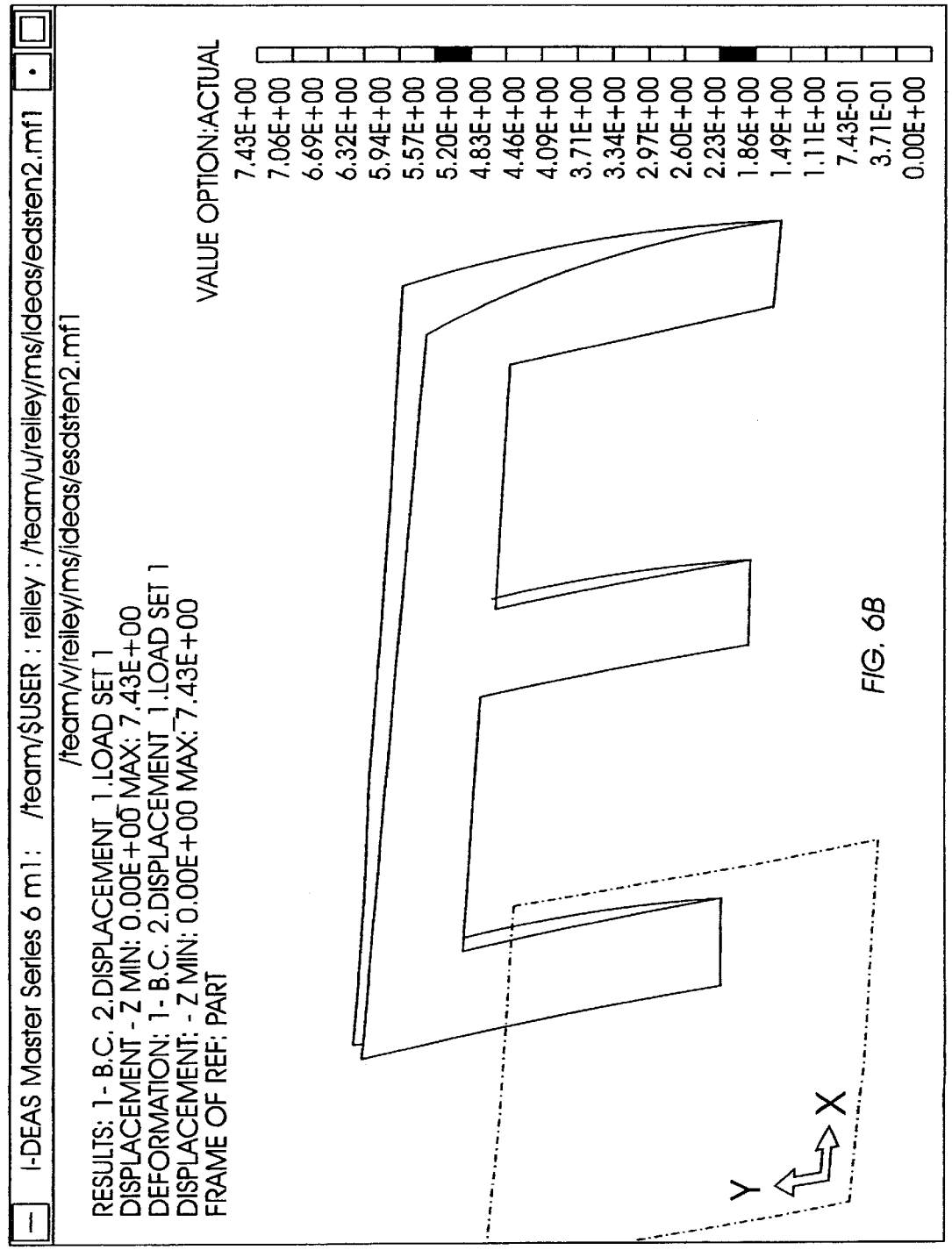
FIG. 6(b) shows the calculated displacement for the double two-material beam bistable switch of FIG. 5 when the right beam leg is heated to 200 C.

FIG. 6(a) shows the calculated displacement for the double two-material beam bistable switch of FIG. 5 when the left beam leg is heated to 200 C. Similarly, FIG. 6(b) shows the calculated displacement for the double two-material beam bistable switch of FIG. 5 when the right beam leg is heated to 200 C. For the calculations of FIGS. 6(a) and 6(b), the materials chosen were 2 microns of Ni and Cr for each two-material beam for a total beam thickness of 4 microns. Central beam leg 503 was chosen to be Cr. For left beam leg 502, Ni was the top layer, and for right beam leg 504, the top layer was Cr. The Cr in central beam leg 503 is assumed to be under a tensile strain (at room temperature) of about 0.1%. For a temperature rise of about 175 K, a tensile strain of about 0.1% is relieved, assuming no change in the temperature of the underlying substrate. This means that the two-material beams may be bent in response to the applied temperature change without having to overcome any mechanical bias.

When central beam leg 503 is cooled, beam leg 503 then mechanically biases the bent beam in the direction of bending established by the imposed change in temperature on the heated two-material leg. When the entire structure is cooled, the central beam leg buckles the entire structure.

The maximum displacements calculated in FIGS. 6(a) and 6(b) are about 7 microns for the imposed 175 K temperature rise and the tensile strain of 0.1% on the Cr central beam leg. This tensile force has little effect on the bending displacement in this calculation because the buckling (which will occur) is not included. This magnitude of displacement will bend the beam across the gap defined by the release layer (several microns thick), and the load of central beam leg 503 will cause buckling which provides the contact load needed for low ohmic contact.

Figure 7A:
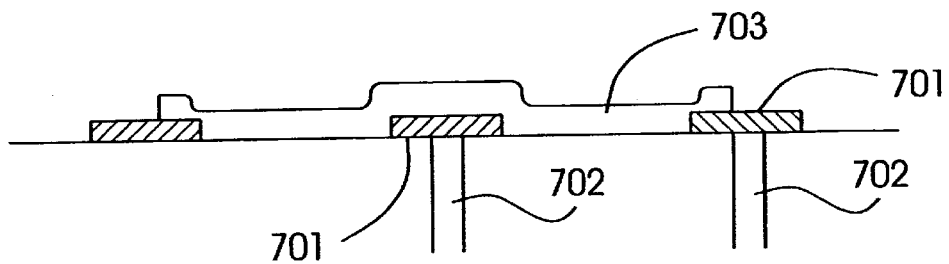
FIGS. 7(a)–7(c) show fabrication steps for a compressive single-beam bistable switch according to the present invention.
Figure 7B:
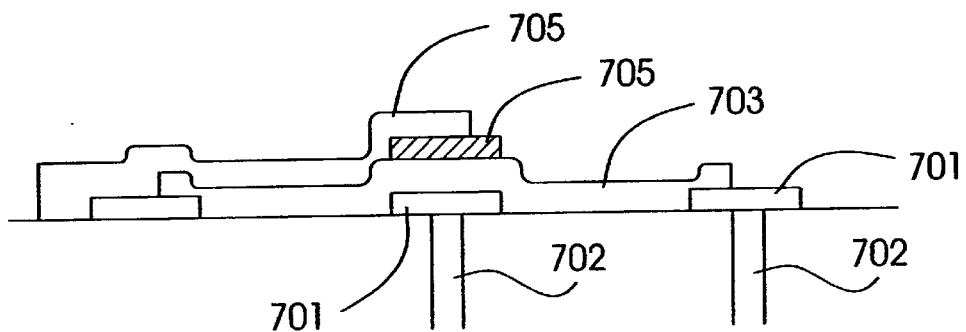
Figure 7C:
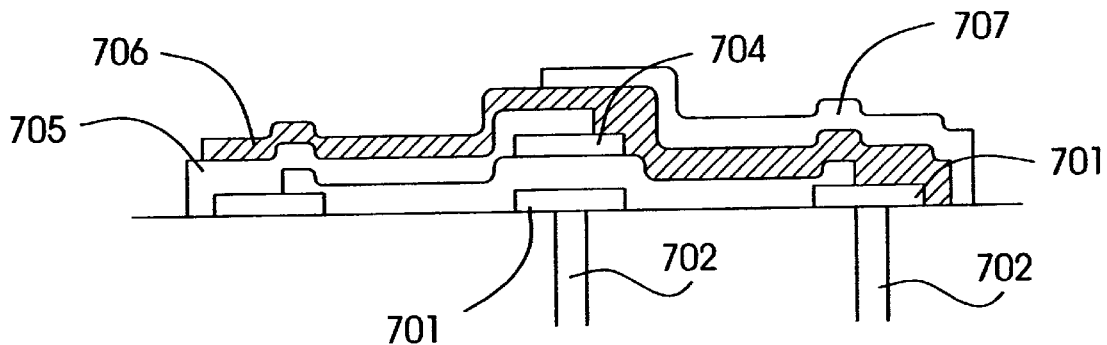

FIGS. 7(a)–7(c) show fabrication steps for a compressive single-beam bistable switch according to the present invention. The process for fabricating either of the compressive or tensile embodiments of the bistable switches of the present invention is similar. The starting structure for both embodiments is preferably a finished recording head wafer. The following is a preferred fabrication sequence for a compressive single-beam bistable switch, although many variations are possible:

In FIG. 7(a), protruding caps 701 formed from Au or Au/Ni are plated on make/break contact via 702. This eases the contact fabrication process because the via cap 701 protrudes from an otherwise planar surface S. Alternatively, a recess can be etched around a via cap. A copper seedlayer 703 is used to allow the electroplating of a copper release layer through a resist pattern so that the copper release layer is beneath the structures that will be released.

In FIG. 7(b), an upper contact 704 (Au or Au/Ni) is pattern electroplated for the movable members. Using a liftoff+photoresist, a first layer 705 of the two-material beam is sputter-deposited (e.g., about 2 microns Cr or Ni). For the tensile bistable switch only, a tensile-stressed layer of material (e.g., 3 microns thick of Cr, about 100 microns wide) is sputtered or evaporated to deposit the central tension beam using a liftoff photoresist process. The width and thickness multiplied by the built-in tensile stress must be sufficient to buckle the entire structure. In FIG. 7(c), a second layer 706 of the two-material beam is deposited using a liftoff process (e.g., about 2 microns thick of Ni or Cr). Using a liftoff process, a third layer 707 of the two-material beam is deposited.

The structure may now be released using a copper etch, although this step may be more convenient or appropriate at a later point in the processing. The structure is then protected using photoresist after release. Once it is desired to use the bistable switch, the photoresist should be removed.

Although the bistable micromechanical switch of the present invention has been disclosed for a particular application, such a bistable micromechanical switch can be used anywhere that such a bistable switch would be useful. For example, a bistable switch can serve as a low power replacement for a relay in many applications. Of particular interest are applications that require a low ON resistance (short) in the absence of power. Such applications could include a meter movement and/or a spindle rotation braking system for shipping protection, and permanent, but reversible switching of communications lines, such as connection and disconnection of cable television or telephone lines, etc. A laser-activated, bistable switch built for a purpose other than ESD protection for recording heads would likely be designed differently, using different materials and processes.

While the present invention has been described in connection with the illustrated embodiments, it will be appreciated and understood that modifications may be made without departing from the true spirit and scope of the invention.

What is claimed is:

1. A bistable micromechanical switch, comprising:
  a substrate having a surface;
  at least two anchor points formed on the substrate; and
  a beam structure including a two-material beam attached to at least two anchor points, the two-material beam having a first portion, a second portion and a center portion, the first portion of the two-material beam being formed from a first layer of a first material and a second layer of a second material, the first layer of the first portion being proximate to the surface of the substrate and the second layer of the first portion being remote from the surface of the substrate, the first material having a first coefficient of thermal expansion and the second material having a second coefficient of thermal expansion, the second coefficient of thermal expansion being greater than the first coefficient of thermal expansion, the second portion of the two-material beam being formed from a first layer of the second material and a second layer of the first material, the first layer of the second portion being proximate to the surface of the substrate and the second layer of the second portion being remote from the surface of the substrate, the beam structure having a first and a second stable state, a center portion of the beam structure being deflected toward the surface of the substrate for the first stable state and the center portion of the beam structure being deflected away from the surface of the substrate for the second stable state.

2. The bistable micromechanical switch according to claim 1, wherein the beam structure transitions from the first stable state to the second stable state when thermal energy is applied to the second portion of the two-material beam.

3. The bistable micromechanical switch according to claim 2, wherein the thermal energy applied to the second portion of the two-material beam is generated by directing a laser beam to the second portion of the two-material beam.

4. The bistable micromechanical switch according to claim 2, wherein the thermal energy applied to the second portion of the two-material beam is generated by passing an electrical current through the second portion of the two-material beam.

5. The bistable micromechanical switch according to claim 1, wherein the beam structure transitions from the second stable state to the first stable state when thermal energy is applied to the first portion of the two-material beam.

6. The bistable micromechanical switch according to claim 5, wherein the thermal energy applied to the first portion of the two-material beam is generated by directing a laser beam to the first portion of the two-material beam.

7. The bistable micromechanical switch according to claim 5, wherein the thermal energy applied to the first portion of the two-material beam is generated by passing an electrical current through the first portion of the two-material beam.

8. The bistable micromechanical switch according to claim 1, wherein the first material is selected from the group consisting of Cr, Ta, W and Mo, and the second material is selected from the group consisting of Ni, Fe and Co.

9. The bistable micromechanical switch according to claim 1, wherein the two-material beam is under a compressive stress.

10. The bistable micromechanical switch according to claim 9, wherein the two-material beam further includes a third portion and a fourth portion, the third portion being located between the first portion and the center portion and the fourth portion being located between the center portion and the second portion, the third portion of the two-material beam being formed from a first layer of the second material and a second layer of the first material, the first layer of the third portion being proximate to the surface of the substrate and the second layer of the third portion being remote from the surface of the substrate, the fourth portion of the two-material beam being formed from a first layer of the first material and a second layer of the second material, and the first layer of the fourth portion being proximate to the surface of the substrate and the second layer of the fourth portion being remote from the surface of the substrate.

11. The bistable micromechanical switch according to claim 1, wherein the bistable micromechanical switch is coupled to a read/write head, and
  wherein when the beam structure is in the first stable state, the read/write head is short-circuited, thereby providing ESD protection.

12. The bistable micromechanical switch according to claim 11, wherein the bistable micromechanical switch is part of a disk drive.

13. The bistable micromechanical switch according to claim 1, further comprising at least three anchor points formed on the substrate;
  wherein the first portion of the two-material beam is a first leg of the beam structure, the first leg being attached to a top of a first anchor point,
  wherein the second portion of the two-material beam is a second leg of the beam structure, the second leg being attached to a top of a second anchor point,
  the beam structure further including a center leg attached between a third anchor point and the center portion of the two-material beam, the center leg being formed from a single-material beam,
  wherein an overall structure of the beam structure being under a tensile stress.

14. The bistable micromechanical switch according to claim 12, wherein the beam structure transitions from the first stable state to the second stable state when thermal energy is applied to the second leg and the center leg of the beam structure.

15. The bistable micromechanical switch according to claim 14, wherein the thermal energy applied to the second leg and the center leg of the beam structure is generated by directing a laser beam to the second leg and the center leg of the beam structure.

16. The bistable micromechanical switch according to claim 14, wherein the thermal energy applied to the second leg and the center leg of the beam structure is generated by passing an electrical current through the second leg and the center leg of the beam structure.

17. The bistable micromechanical switch according to claim 13, wherein the beam structure transitions from the second stable state to the first stable state when thermal energy is applied to the first leg and the center leg of the beam structure.

18. The bistable micromechanical switch according to claim 17, wherein the thermal energy applied to the first leg and the center leg of the beam structure is generated by directing a laser beam to the first leg and the center leg of the beam structure.

19. The bistable micromechanical switch according to claim 17, wherein the thermal energy applied to the first leg and the center leg of the beam structure is generated by passing an electrical current through the first leg and the center leg of the beam structure.

20. The bistable micromechanical switch according to claim 1, further comprising a contact element formed on the surface of the substrate, and
wherein the center portion of the beam structure contacting the contact element on the surface of the substrate when the beam structure is in the first stable state.

21. The bistable micromechanical switch according to claim 20, further comprising a contact element formed on the center portion of the beam structure proximate to the surface of the substrate, the contact element formed on the center portion of the beam structure contacting the contact element on the surface of the substrate when the beam structure is in the first stable state.

22. The bistable micromechanical switch according to claim 21, wherein each contact element is formed from a Au/Ni alloy.

23. The bistable micromechanical switch according to claim 20, wherein the bistable micromechanical switch is connected to a read/write head, and
wherein when the beam structure is in the first stable state, the read/write head is short-circuited, thereby providing ESD protection.

24. The bistable micromechanical switch according to claim 23, wherein the bistable micromechanical switch is part of a disk drive.

25. The bistable micromechanical switch according to claim 23, wherein the read/write head includes one of a magnetoresistive head, a giant magnetoresistive head and a magnetic tunnel junction head.

26. The bistable micromechanical switch according to claim 1, wherein the first and second portions of the two-material beam include an anti-reflective coating remote from the surface of the substrate.

27. The bistable micromechanical switch according to claim 26, wherein the anti-reflective coating absorbs light having a wavelength that is in the range of about 0.8 to 1.5 microns.

* * * * *